(12) United States Patent
Pinna et al.

(10) Patent No.: US 6,518,901 B2
(45) Date of Patent: Feb. 11, 2003

(54) BOOSTED SWITCH DEVICE FOR A SAMPLER OF AN ANALOG/DIGITAL CONVERTER, AND OPERATING METHOD THEREOF

(75) Inventors: Carlo Pinna, Sassari (IT); Germano Nicollini, Piacenza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/884,872

(22) Filed: Jun. 18, 2001

(65) Prior Publication Data

US 2002/0021162 A1 Feb. 21, 2002

(30) Foreign Application Priority Data

Jun. 19, 2000 (EP) .............................. 00830430

(51) Int. Cl.[7] .......................... H03M 1/00; G01C 27/02; H03K 5/00
(52) U.S. Cl. ........................... 341/122; 327/91; 327/589
(58) Field of Search ............................ 341/122, 123, 341/155; 327/91, 390, 589

(56) References Cited

U.S. PATENT DOCUMENTS 5,500,612 A * 3/1996 Sauer ........................ 327/91
5,945,872 A * 8/1999 Robertson ................... 327/541
6,072,355 A * 6/2000 Bledsoe ..................... 341/122
6,310,565 B1 * 10/2001 Ong et al. .................. 341/122
6,323,697 B1 * 11/2001 Pavan ......................... 327/94

OTHER PUBLICATIONS

Brooks et al., "A Cascade Sigma–Delta Pipeline A/D Converter with 1.25 MHz Signal Bandwidth and 89 dB SNR," *IEEE Journal of Solid–State Circuits* 32(12): pp 1896–1905, Dec. 1997.

Lee et al., "Low–Distortion Switched–Capacitor Filter Design Techniques," *IEEE Journal of Solid–State Circuits* 20(6): pp 1103–1112, Dec. 1985.

* cited by examiner

*Primary Examiner*—Howard L. Williams
(74) *Attorney, Agent, or Firm*—Lisa K. Jorgenson; Harold H. Bennett, II; Seed IP Law Group PLLC

(57) ABSTRACT

The boosted switch device comprises an input terminal and an output terminal; a supply line set to a supply potential; a ground line set to a ground potential; a transistor connected between the input and output terminals; a capacitor; and a switch device connecting the capacitor between the supply line and the ground line, when the transistor is off, and between the input terminal and the control terminal of the transistor, when the transistor is on.

14 Claims, 2 Drawing Sheets

BOOSTED SWITCH DEVICE FOR A SAMPLER OF AN ANALOG/DIGITAL CONVERTER, AND OPERATING METHOD THEREOF

TECHNICAL FIELD

The present invention relates to a boosted switch device for a sampler of an analog/digital converter, and to an operating method thereof.

BACKGROUND OF THE INVENTION

As is known, broadly speaking, analog/digital conversion systems can be subdivided into two main categories, according to the conversion principle on the basis of which they operate: the first category includes the so-called Nyquist analog/digital conversion systems, which can be schematized with a continuous-time anti-aliasing filter, a switched-capacitor channel filter, and a Nyquist analog/digital converter, which are connected to one another in cascade, whereas the second category includes the so-called over-sampling analog/digital conversion systems, which can be schematized with a continuous-time anti-aliasing filter, an over-sampling analog/digital converter, and a digital channel filter which are connected to one another in cascade.

However, both categories carry out the conversion of an analog signal, i.e., of a signal which is continuous in time and in amplitude, into a sampled data signal, i.e., which is continuous in time and discrete in amplitude, by means of a so-called sampler.

FIG. 1 shows the general circuit diagram of the sampler which is best known and most commonly used in the applications.

In particular, as illustrated in FIG. 1, the sampler, indicated as a whole by 1, comprises an input terminal 2, at which there is present an input voltage $V_A$ to be sampled; an output terminal 4; a sampling capacitor 6 connected between a first and a second node 8, 10; a first switch device 12 controlled by a first control signal F1D, and connected between the input terminal 2 of the sampler 1 and the first node 8; a second switch device 14 controlled by a second control signal F2D, and connected between the first node 8 and a ground line 16 set to a ground potential $V_{GND}$, typically 0 V; a third switch device 18 controlled by a third control signal F1, and connected between the second node 10 and the ground line 16; and a fourth switch device 20 controlled by a fourth control signal F2, and connected between the output terminal 4 of the sampler 1, and the second node 10.

The output terminal 4 of the sampler is then typically connected to the virtual ground of an operational amplifier (not shown), with which it forms a switched-capacitor integrator.

On the other hand, FIG. 2 shows the temporal development of the four control signals F1, F2, F1D, F2D, which are commonly also known as "phases," and are supplied to the switch devices 12, 14, 18, 20 of the sampler 1. In particular, it can be noted that the first and the second control signals F1D and F2D are exact replicas respectively of the third and fourth control signals, which are temporally delayed compared with the latter, by a delay $T_R$ of approximately a few nanoseconds.

In addition, in order to guarantee correct operation of the sampler 1, the first and second control signals F1D and F2D do not overlap one another temporally, in other words the first and second control signals F1D and F2D never assume a high logic level simultaneously, just as the third and fourth control signals F1 and F2 do not overlap one another temporally. In addition, neither the first and fourth control signals F1D, F2, nor the second and third control signals F2D, F1 overlap one another temporally.

The operation of the sampler 1 is known, and will thus be described here briefly and only to the extent necessary for understanding of the problem on which the present invention is based.

In particular, according to the logic levels assumed by the control signals F1, F2, F1D and F2D, the sampler capacitor 6 is connected cyclically and in an alternating manner between the input terminal 2 and the ground line 16, and between the latter and the output terminal 4. In detail, when the first and the fourth control signals F1, F1D assume a high logic level, the input voltage $V_A$ is sampled, and the sample is stored in the sampler capacitor 6, whereas when the second and the third control signal F2, F2D assume a high logic level, the sample of the input voltage $V_A$ which is stored in the sampler capacitor 6 is transferred to the output terminal 4 of the sampler 1, and consequently to the virtual ground of the operational amplifier, with which it forms the aforementioned switched-capacitor integrator.

The use of four control signals having the timings shown in FIG. 2 has been proposed in "Low-Distortion Switched-Capacitor Filter Design Techniques," Kuang-Lu Lee and Robert G. Mayer, IEEE Journal of Solid-State Circuits, vol. sc-20, No. 6, December 1985, Section III B, pages 1103–1112, in order to overcome the disadvantages of the prior art samplers, in which the first and second switch devices 12, 14 are controlled respectively by the control signal F1 and by the control signal F2, instead of by their temporally delayed replicas.

In particular, the prior art samplers had the disadvantage that they introduced onto the output signal $V_B$ unacceptable distortions, generated mainly by the switch devices 12, 14, 18, 20. In fact, since these switch devices are not ideal, but have capacitances, and thus associated charges, which vary strongly according to the input voltage $V_A$, at the instant at which these switch devices open, they introduce onto the output signal $V_B$ distortions which detract considerably from the performance of the sampler.

As demonstrated in the aforementioned article, by using instead, the control signals shown in FIG. 2 with the structure shown in FIG. 1, the distortion of the output signal $V_B$ is strongly reduced, for input frequencies lower than 10 kHz, i.e., for harmonics of the input voltage $V_A$ with frequencies lower than 10 kHz.

However, at high frequencies, and in particular at input frequencies greater than 100 kHz, there is an ever greater increase in other distortions caused mainly by the circuit structure of the first switch device 12, and on which the solution proposed in the aforementioned article does not have any effect, as explained in depth in "A Cascaded Sigma-Delta Pipeline A/D Converter with 1.25 MHz Signal Bandwidth and 89 dB SNR," Todd L. Brooks, David H. Robertoson, Daniel F. Kelly, Anthony Del Muro and Stephen W. Harston, IEEE Journal Solid-State Circuits, vol. 32, No. 12, December 1997, Section IV B, pages 1896–1905.

In particular, according to the prior art, the first switch device 12 was usually formed by a CMOS transfer-gate switch having the circuit structure shown in FIG. 3, i.e., formed by an NMOS transistor 22 and by a PMOS transistor 24 having drain terminals connected to one another and to the input terminal 2 of the sampler 1, source terminals connected to one another and to the first node 8, and gate terminals receiving respectively the first control signal F1D and the first inverted control signal $\overline{F1D}$, the latter being generated by means of a logic inverter (not shown).

As explained in the aforementioned article, the switch devices with the circuit structure shown in FIG. 3 have series resistances that vary considerably according to the input voltage $V_A$, thus causing strong distortions at a high frequency.

In order to overcome the limitations inherent in the switch devices having the circuit structure shown in FIG. 3, in the aforementioned article, a switch device having the circuit structure shown in FIG. 4 is proposed, which, for the reasons given hereinafter, is commonly known as "bootstrapped clock-boosted switch."

In particular, as shown in this Figure, the switch device, indicated as a whole by 12', comprises an NMOS transistor 30 having a drain terminal connected to the input terminal 2 of the sampler 1, a source terminal connected to the first node 8 of the sampler 1, and a gate terminal connected to a third node 32; a PMOS transistor 34 having a drain terminal connected to the third node 32, source and bulk terminals connected to one another and to a fourth node 36, and a gate terminal receiving the first inverted control signal $\overline{F1D}$; and an NMOS transistor 38 having a drain terminal connected to the third node 32, a source terminal connected to the ground line 16, and a gate terminal receiving the second control signal F2D.

The switch device 12' further comprises an amplifier 40, and a CMOS transfer-gate switch 42, which are connected to one another in series between the input terminal 2 and the fourth node 36. In particular, the amplifier 40 has a unity gain, whereas the CMOS transfer-gate switch 42 is formed by an NMOS transistor 44 and a PMOS transistor 46, having drain terminals connected to one another and to the output terminal of the amplifier 40, source terminals connected to one another and to the fourth node 36, and gate terminals receiving respectively the second control signal F2D and the second inverted control signal $\overline{F2D}$, the latter being generated by means of a logic inverter (not shown).

The switch device 12' further comprises a so-called bootstrap capacitor 48 connected between the fourth node 36 and a fifth node 50; a PMOS transistor 52 having a drain terminal connected to the fifth node 50, a source terminal connected to a supply line 54 set to a supply potential $V_{CC}$, typically approximately 3 V, and a gate terminal receiving the first inverted control signal $\overline{F1D}$; and an NMOS transistor 56 having a drain terminal connected to the fifth node 50, a source terminal connected to the ground line 16, and a gate terminal receiving the second control signal F2D.

The operation of the switch device 12' is described fully in the aforementioned article, and is therefore summarized hereinafter only to the extent necessary for understanding of the problem on which the present invention is based.

In particular, the NMOS transistor 30 acts as a switch, and is on when the first control signal F1D is in the high logic state, and is off when the first control signal F1D is in the low logic state, whereas the bootstrap capacitor 48 acts as a floating battery.

When the control signal F2D is in the high logic state, and therefore, owing to the non-overlapping condition, the first control signal F1D is in the low logic state, the NMOS transistors 38 and 56 are on, the CMOS switch 42 is closed, and the PMOS transistors 34 and 52 are off. Thus, the third node 32 is connected to the ground line 16, and therefore keeps the NMOS transistor 30 off, whereas the bootstrap capacitor 48 is connected between the output terminal of the amplifier 40, at which the input voltage $V_A$ is present, since the amplifier 40 has a unity gain, and the ground line 16, and therefore the input voltage $V_A$ is applied to the terminals of the bootstrap capacitor 48.

On the other hand, when the first control signal F1D is in the high logic state, and the second control signal F2D is in the low logic state, the NMOS transistors 38 and 56 are off, the CMOS switch 42 is open, and the PMOS transistors 34 and 52 are on, such that the bootstrap capacitor 48 is connected between the supply line 60 and the gate terminal of the NMOS transistor 64.

In particular, the fifth node 50 is connected to the supply line 54, and therefore to the fourth node 36, and consequently, a voltage equivalent to $V_{CC+VA}$ is present at the gate terminal of the NMOS transistor 30.

Therefore, depending on the logic levels assumed by the control signals F2D, $\overline{F2D}$ and $\overline{F1D}$, the bootstrap capacitor 48 is connected cyclically and in an alternating manner between the input terminal 2 and the gate terminal of the NMOS transistor 30, and between the latter and the supply line 54. Thus, by this means, the gate-source voltage $V_{GS}$ and the drain-source voltage $V_{DS}$ of the NMOS transistor 30 during conduction, are approximately constant, and equivalent to the supply voltage $V_{CC}$, independently of the input voltage $V_A$ (bootstrapping effect of the gate-source voltage) and the potential of the gate terminal of the NMOS transistor 30 exceeds the supply voltage $V_{CC}$ supplied to the switch device 12' (boosting effect of the gate terminal), and hence the name "bootstrapped clock-boosted switch" of the switch device 12'.

Since the series resistance $R_{ON}$ of a MOS device during conduction is, in the first approximation, inversely proportional to the difference between the gate-source voltage $V_{GS}$ and the threshold voltage $V_{TH}$ of the MOS device, if the gate-source voltage $V_{GS}$ is independent from the input voltage $V_A$, the sole cause of distortion is that which is associated with dependence of the threshold voltage $V_{TH}$ on the input voltage $V_A$, which is in any case somewhat small.

A first limitation of the switch device 12' consists in the fact that the input voltage $V_A$ must have a bandwidth which is limited to frequencies which are far smaller than the sampling frequency, otherwise the variations in the input voltage $V_A$ from one phase to the next, i.e., from the phase in which the first control signal F1D is in the high logic state and the second control signal F2D is in the low logic state, to the opposite phase, in which the first control signal F1D is in the low logic state, and the second control signal F2D is in the high logic state, would be high, the gate-source voltage $V_{GS}$ of the NMOS transistor 30 would not be constant and equivalent to the supply voltage $V_{CC}$, and therefore all the advantages of the structure described in the aforementioned article would be lost.

This consequently involves the need to use a sampling frequency which is far greater than the Nyquist sampling frequency (it should be remembered that according to the known Nyquist theorem, in order to avoid losing information during the sampling, it is sufficient to use a sampling frequency which is equivalent to double the maximum input frequency, i.e., which is equivalent to double the maximum frequency of the harmonics of the input signal $V_A$), with a consequent waste of power and area on the silicon.

A second limitation of the switch device 12' consists in the fact that when the first control signal F1D is in the high logic state, the third and fourth nodes 32, 36 go to a voltage which is equivalent to $V_{CC}+V_A$, such that problems of reliability could arise if $V_{CC}+V_A$ were greater than the maximum operating voltage which can be withstood by integrated devices, which is determined by the technological process used for manufacture of the integrated devices.

For example, in a technological process at 0.5 μm, the maximum operating voltage which can be withstood by integrated devices is equivalent to 4.6 V, and if the supply voltage $V_{CC}$ were equivalent to 3.3 V, as is typically required by the user, in order for $V_{CC}+V_A$ not to exceed the maximum operating voltage, it is necessary to limit the maximum input voltage $V_A$ to 1.3 V, and this leads to a loss of signal/noise ratio of the A/D converter in which the switch device 12' is inserted.

SUMMARY OF THE INVENTION

According to an embodiment of the present invention, a boosted switch device for a sampler of an analog/digital converter is provided. The boosted switch device comprises an input terminal and an output terminal; a supply line set to a supply potential; a ground line set to a ground potential; a switch connected between the input and output terminals; a capacitor; and a switch device connecting the capacitor between the supply line and the ground line, when the switch is open, and between the input terminal and the control terminal of the switch, when the switch is closed.

According to another embodiment of the present invention, a sampler for an analog/digital converter is also provided. The sampler of the invention includes a boosted switch input terminal, a boosted switch output terminal, a first switch arranged between the input and output terminals, a charge storage device; and controlled connection means connecting the charge storage device in an alternating manner between a voltage supply line and circuit ground, and between the boosted switch input terminal and a control terminal of the first switch. The sampler may also include a second charge storage device connected to the boosted switch output terminal.

According to another embodiment of the present invention, an operating method of a boosted switch device for a sampler of an analog/digital converter is also provided. The method includes connecting a charge storage means in an alternating manner between a first line set to a first potential and a second line set to a second potential, and between an input terminal of a switch means and a control terminal of the switch means.

BRIEF DESCRIPTION OF THE DRAWINGS

In order to assist understanding of the present invention, a preferred embodiment is now described, purely by way of non-limiting example, with reference to the attached drawings, in which.

DETAILED DESCRIPTION OF THE INVENTION

Figure 1:
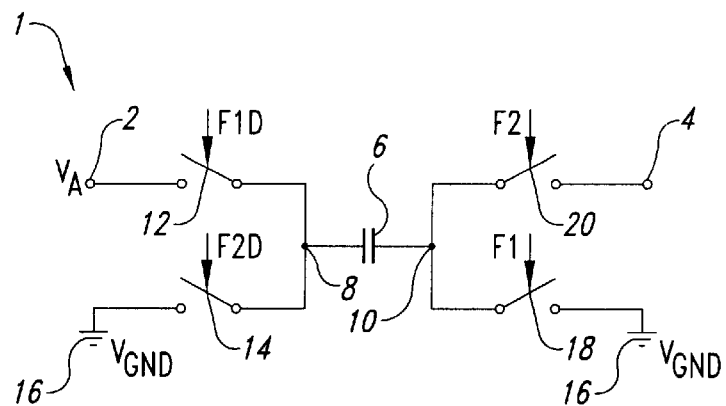
FIG. 1 shows a general circuit diagram of a sampler according to the known art.
Figure 2:
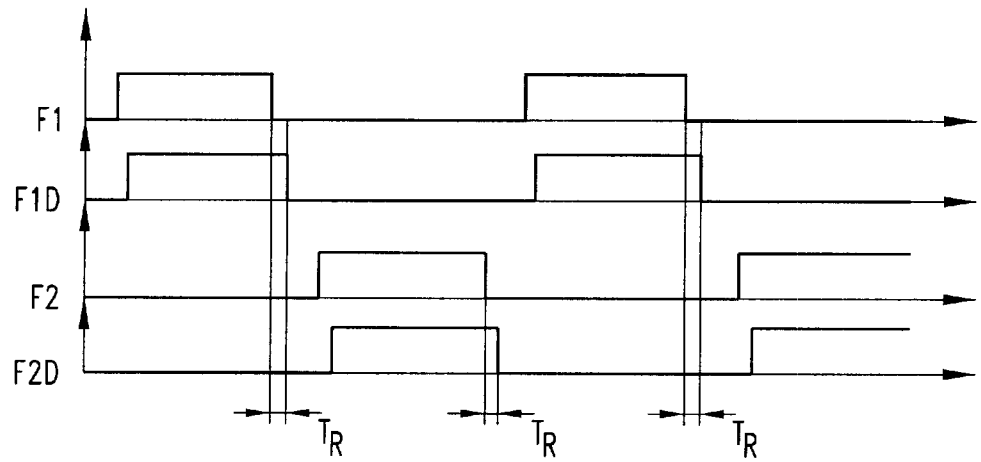
FIG. 2 shows temporal developments of control signals supplied to the sampler in FIG. 1.
Figure 3:
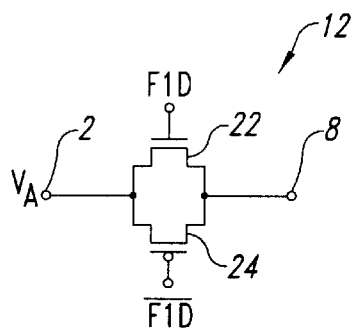
FIG. 3 shows the circuit diagram of a first switch device according to the known art, used in the sampler in FIG. 1.
Figure 4:
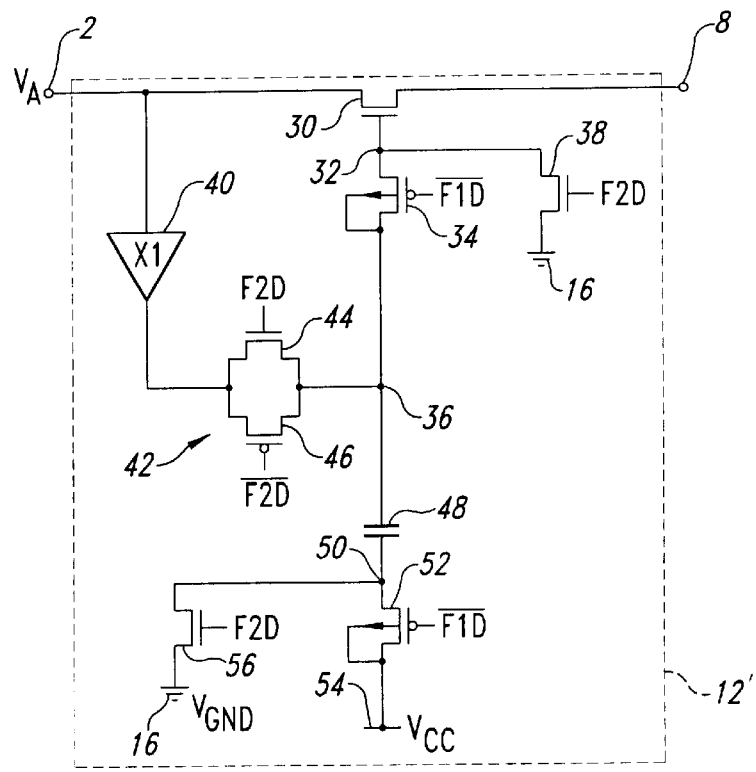
FIG. 4 shows the circuit diagram of a second switch device according to the known art, used in the sampler in FIG. 1.
Figure 5:
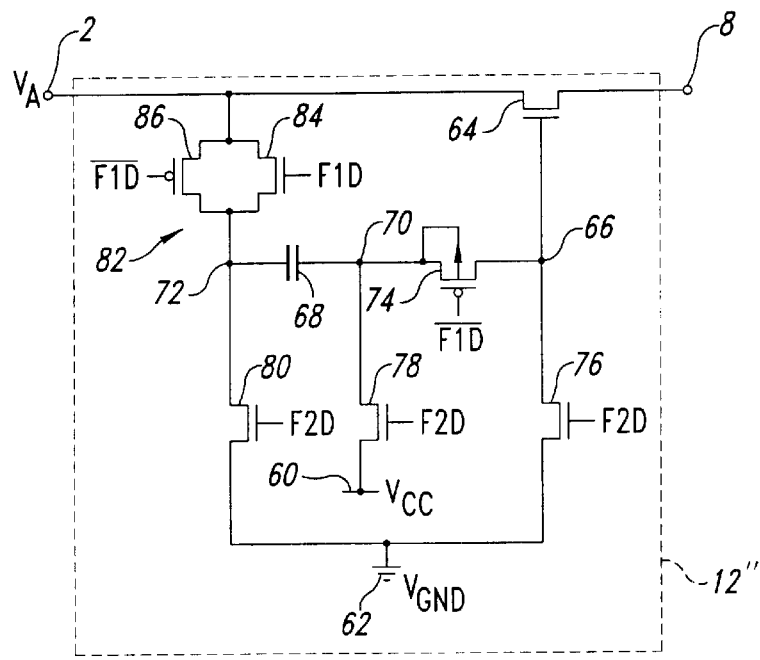
FIG. 5 shows the circuit diagram of a boosted switch device according to the present invention, used in the sampler in FIG. 1.

In FIG. 5, 12" indicates as a whole a switch device according to an embodiment of the present invention.

The switch device 12" comprises a supply line 60 set to a supply potential $V_{CC}$, typically approximately 3 V; a ground line 62 set to a ground potential $V_{GND}$, typically 0 V; an NMOS transistor 64 having a drain terminal connected to the input terminal 2 of the sampler 1, a source terminal connected to the node 8 of the sampler 1, and a gate terminal connected to a first node 66; a bootstrap capacitor 68 connected between a second and a third node 70, 72; a PMOS transistor 74 having a drain terminal connected to the first node 66, source and bulk terminals connected to the second node 70, and a gate terminal receiving the first inverted control signal $\overline{F1D}$; an NMOS transistor 76 having a drain terminal connected to the first node 66, a source terminal connected to the ground line 62, and a gate terminal receiving the second control signal F2D; an NMOS transistor 78 having a drain terminal connected to the supply line 60, a source terminal connected to the second node 70, and a gate terminal receiving the second control signal F2D; an NMOS transistor 80 having a drain terminal connected to the third node 72, a source terminal connected to the ground line 62, and a gate terminal receiving the second control signal F2D; and a CMOS transfer-gate switch 82 connected between the input terminal 2 and the third node 72, and formed by an NMOS transistor 84 and a PMOS transistor 86, having drain terminals connected to one another and to the input terminal 2, source terminals connected to one another and to the third node 72, and gate terminals receiving respectively the first control signal F1D and the first inverted control signal $\overline{F1D}$, the latter being generated by means of a logic inverter (not shown).

The switch device 12" operates as follows.

The NMOS transistor 64 acts as a switch, and is on when the first control signal F1D is in the high logic state, and is off when the first control signal F1D is in the low logic state, whereas the bootstrap capacitor 68 acts as a floating battery.

When the control signal F2D is in the high logic state, and therefore, owing to the non-overlapping condition, the first control signal F1D is in the low logic state, the NMOS transistors 76, 78 and 80 are on, the CMOS switch 82 is open, and the PMOS transistor 74 is off. Thus, the first node 66 is connected to the ground line 62, and therefore keeps the NMOS transistor 64 off, whereas the bootstrap capacitor 68 is connected between the supply line 60 and the ground line 62, and therefore the supply voltage $V_{CC}$ is applied to the terminals of the bootstrap capacitor. In addition, since the bootstrap capacitor 68 is charged by means of the NMOS transistor 78 having its drain terminal biased to the supply voltage $V_{CC}$, the source terminal of the NMOS transistor 78 can be taken to a voltage which is equivalent at the most to $V_{CC}-V_{TH}$, such that the bootstrap capacitor 68 is charged to a voltage equivalent to $V_{CC}-V_{TH}$.

On the other hand, when the first control signal F1D is in the high logic state, and the second control signal F2D is in the low logic state, the NMOS transistors 76, 78 and 80 are off, the CMOS switch 82 is closed, and the PMOS transistor 74 is on, such that the bootstrap capacitor 68 is connected between the input terminal 2 and the gate terminal of the NMOS transistor 64.

In particular, the third node 72 is connected to the input terminal 2, at which the input voltage $V_A$ is present, whereas at the second node 70, and therefore at the gate terminal of the NMOS transistor 64, a voltage equivalent to approximately $V_{CC}-V_{TH}+V_A$ is present. Thus, by this means, the gate-source voltage $V_{GS}$ and the gate-drain voltage $V_{GD}$ of the NMOS transistor 64 during conduction, are approximately constant, and equivalent to $V_{CC}-V_{TH}$, independently of the input voltage $V_A$ (bootstrapping effect of the gate-source voltage) and the potential of the gate terminal of the NMOS transistor 64 exceeds the supply voltage $V_{CC}$ supplied to the switch device 12" (boosting effect of the gate terminal), with the advantages concerning linearization of the series resistance $R_{ON}$ of the NMS transistor 64 during conduction, previously described for the switch device 12'.

Thus, unlike the prior art switch device 12', in which the bootstrap capacitor 48 is connected cyclically and in an alternating manner between the input terminal 2 and the ground line 16, and between the supply line 54 and the gate terminal of the NMOS transistor 30, in the switch device 12", the bootstrap capacitor 68 is connected cyclically and in an alternating manner between the supply line 60 and the ground line 62, and between the input terminal 2 and the gate terminal of the NMOS transistor 64.

By this means, therefore, the switch device 12" maintains the advantages of the switch device 12', but does not have the disadvantages of the latter. In fact, the variations in the input voltage $V_A$ are "seen" instantly on the gate terminal of the NMOS transistor 64, such that the gate-source voltage $V_{GS}$ of the NMOS transistor 64 always remains constant, irrespective of the maximum frequency of the input voltage $V_A$, and therefore it is not necessary to limit the bandwidth thereof, such that it is possible to use the Nyquist sampling frequency, with the resulting benefits from the point of view of waste of power and area on the silicon.

In addition, in the switch device 12", when the first control signal F1D is in the high logic state, the first and the second nodes 66 and 70 go to a voltage equivalent to $V_{CC}-V_{TH}+V_A$, such that the problems of reliability, which arise only if $V_{CC}-V_{TH}+V_A$ is greater than the maximum operating voltage which can be withstood by integrated devices, are greatly reduced. In fact, considering again the example previously given, involving a technological process at 0.5 $\mu$m, in which the maximum operating voltage which can be withstood by integrated devices is equivalent to 4.6 V, with a supply voltage $V_{CC}$ equivalent to 3.3 V, in order for $V_{CC}-V_{TH}+V_A$ not to exceed the maximum operating voltage, it is necessary to limit the maximum input voltage $V_A$ to 2.3 V (on the assumption that $V_{TH}$=1 V), with a consequent gain in the signal/noise ratio of the A/D converter, in which the switch device 12" is used, of 77%, compared with that which can be obtained using the prior art switch device 12'.

Finally, it is apparent that modifications and variants can be made to the switch device 12" described, without departing from the protective context of the present invention, as defined in the attached claims.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. Boosted switch device comprising:
    an input terminal;
    an output terminal;
    a first switching element arranged between said input and output terminals, and having a control terminal;
    a first line set to a first potential;
    a second line set to a second potential;
    charge storage means; and
    controlled connection means configured to connect said charge storage means in an alternating manner between said first and second lines and between said input terminal and said control terminal of the first switching element, the circuit including a second switching element arranged between the control terminal of the first switching element and a first terminal of said charge storage means and a third switching element arranged between the control terminal and the first line, the second switching element having a control terminal receiving a first control signal, and the third switching element having a control terminal receiving a second control signal, independent of the first control signal.

2. Boosted switch device according to claim 1 wherein said controlled connection means connect said charge storage means between said first and second lines, when said first switching element assumes a first operating condition, and between said input terminal and said control terminal, when said first switching assumes a second operating condition.

3. Boosted switch device according to claim 2 wherein said first operating condition is an opening condition of said first switching element, and said second operating condition is a closure condition of said first switching element.

4. Boosted switch device according to claim 1 wherein said controlled connection means further comprise:
    a fourth switch element having a first terminal connected to said second line, a second terminal connected to said first terminal of said charge storage means, and a control terminal receiving said second control signal;
    a fifth switch element having a first terminal connected to a second terminal of said charge storage means, a second terminal connected to said first line, and a control terminal receiving said second control signal; and
    a sixth switch element having a first terminal connected to said input terminal, and a second terminal connected to said second terminal of said charge storage means.

5. Boosted switch device according to claim 4 wherein said first, second, third, fourth and fifth switch means comprise respective MOS transistors, and said sixth switch means comprise a CMOS switch receiving said first control signal, and a third control signal obtained by inverting said first control signal.

6. Boosted switch device according to claim 5 wherein said second and third control signals do not overlap one another temporally.

7. Boosted switch device according to claim 1 wherein said charge storage means comprise a capacitor.

8. Boosted switch device according to claim 1 wherein said first line is a ground line set to a ground potential, and said second line is a supply line set to a supply potential.

9. Sampler, comprising:
    a boosted switch input terminal;
    a boosted switch output terminal;
    first switch means arranged between said boosted switch input and boosted switch output terminals, and having a control terminal;
    a first line set to a first potential;
    a second line set to a positive supply voltage;
    charge storage means; and
    controlled connection means connecting said charge storage means in an alternating manner between said first and second lines and between said boosted switch input terminal and said control terminal.

10. Sampler according to claim 9, further comprising:
    an input terminal connected to said boosted switch input terminal; and further charge storage means connected to said boosted switch output terminal.

11. Operating method of a boosted switch device comprising:

connecting charge storage means in an alternating manner between a first line set to a first potential and a second line set to a second potential, and between an input terminal of a first switch and a control terminal of the first switch using a circuit that includes a second switch connected between the control terminal of the first switch and the charge storage means, and a third switch connected between the control terminal of the first switch and the second line, the connecting step including:

driving a control terminal of the second switch with a first control signal; and driving a control terminal of the third switch with a second control signal that is independent of the first control signal.

12. Method according to claim 11 wherein said connecting step comprises the steps of:

connecting said charge storage means between said first and second lines, when said first switch means assume a first operating condition; and connecting said charge storage means between said input terminal and said control terminal, when said first switch means assume a second operating condition.

13. Method according to claim 12 wherein said first operating condition is a open condition of said first switch means, and said second operating condition is a closed condition of said first switch means.

14. A sampler comprising:

an input stage connected between an input terminal and a first node, the input stage including:

a switch having a control terminal and connected between the input terminal and the first node, a first line set to a first potential, a second line set to a positive supply voltage, a first charge storage device, and controlled connection means controlling connection of the charge storage device alternately between the first and second lines during a first phase and between the input terminal and the control terminal during a second phase;

a second charge storage device connected between the first node and a second node; and an output stage connected between the second node and an output terminal.

* * * * *